(12) United States Patent
Kinoshita

(10) Patent No.: US 10,522,676 B2
(45) Date of Patent: Dec. 31, 2019

(54) SEMICONDUCTOR DEVICE AND METHOD OF MANUFACTURING SEMICONDUCTOR DEVICE

(71) Applicant: Fuji Electric Co., Ltd., Kanagawa (JP)

(72) Inventor: Akimasa Kinoshita, Nagano (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 16/221,272

(22) Filed: Dec. 14, 2018

(65) Prior Publication Data
US 2019/0131449 A1    May 2, 2019

Related U.S. Application Data

(63) Continuation of application No. 15/665,883, filed on Aug. 1, 2017, now Pat. No. 10,276,709.

(30) Foreign Application Priority Data

Sep. 14, 2016   (JP) ................. 2016-180034

(51) Int. Cl.
*H01L 29/78* (2006.01)
*H01L 29/10* (2006.01)
(Continued)

(52) U.S. Cl.
CPC ........ *H01L 29/7813* (2013.01); *H01L 21/046* (2013.01); *H01L 29/0623* (2013.01);
(Continued)

(58) Field of Classification Search
CPC . H01L 29/7813; H01L 29/1079; H01L 29/36; H01L 29/0865; H01L 29/41741;
(Continued)

(56) References Cited

U.S. PATENT DOCUMENTS 8,564,060 B2   10/2013  Shimizu et al.
2009/0072301 A1*  3/2009  Bhalla ............... H01L 29/407
257/328

(Continued)

FOREIGN PATENT DOCUMENTS

| JP | 2011-023675 A | 2/2011 |
| JP | 4678902 B2    | 4/2011 |
| JP | 2015-72999 A  | 4/2015 |

*Primary Examiner* — Ahmed N Sefer
(74) *Attorney, Agent, or Firm* — Chen Yoshimura LLP

(57) ABSTRACT

A MOS gate having a trench gate structure is formed on the front surface side of a silicon carbide substrate. A gate trench of the trench gate structure goes through an $n^+$ source region and a p-type base region and reaches an $n^-$ drift region. Between adjacent gate trenches, a first $p^+$ region that goes through the p-type base region in the depth direction and reaches the $n^-$ drift region is formed at a position separated from the gate trenches. The first $p^+$ region is formed directly beneath a $p^{++}$ contact region. The width of the first $p^+$ region is less than the width w1 of the gate trench. A second $p^+$ region is formed at the bottom of the gate trench. The first and second $p^+$ regions are silicon carbide epitaxial layers.

21 Claims, 5 Drawing Sheets

(51) Int. Cl.
*H01L 29/16* (2006.01)
*H01L 29/66* (2006.01)
*H01L 21/04* (2006.01)
*H01L 29/06* (2006.01)
*H01L 29/04* (2006.01)

(52) U.S. Cl.
CPC ...... *H01L 29/1095* (2013.01); *H01L 29/1608* (2013.01); *H01L 29/66068* (2013.01); *H01L 29/66734* (2013.01); *H01L 29/045* (2013.01)

(58) Field of Classification Search
CPC ............ H01L 29/4236; H01L 29/1608; H01L 29/7827; H01L 29/66068; H01L 29/66666; H01L 29/66734; H01L 21/02529; H01L 21/02378; H01L 21/02634; H01L 29/1095; H01L 29/045
See application file for complete search history.

(56) References Cited

U.S. PATENT DOCUMENTS

| | | | |
|---|---|---|---|
| 2009/0140330 A1* | 6/2009 | Yagi | H01L 21/76202 257/330 |
| 2009/0283776 A1 | 11/2009 | Iwamuro | |
| 2012/0037955 A1* | 2/2012 | Hirler | H01L 21/26506 257/140 |
| 2014/0042525 A1 | 2/2014 | Darwish et al. | |
| 2014/0264562 A1* | 9/2014 | Cheng | H01L 29/7827 257/330 |
| 2015/0333126 A1 | 11/2015 | Fukui et al. | |
| 2016/0247910 A1 | 8/2016 | Suzuki et al. | |
| 2017/0221714 A1 | 8/2017 | Wakimoto et al. | |

\* cited by examiner

SEMICONDUCTOR DEVICE AND METHOD OF MANUFACTURING SEMICONDUCTOR DEVICE

BACKGROUND OF THE INVENTION

Technical Field

The present invention relates to a semiconductor device and a method of manufacturing the semiconductor device.

Background Art

Silicon carbide (SiC) exhibits various advantageous physical properties in comparison with silicon (Si), such as a bandgap that is approximately three times greater, a dielectric breakdown field strength that is nearly an order of magnitude greater, and a high saturated drift velocity for electrons. Therefore, although silicon has been widely used as the material for conventional power semiconductor devices, using silicon carbide as the material for power semiconductor devices is effective in terms of achieving performance that exceeds that of silicon power semiconductor devices.

Moreover, in the field of vertical metal-oxide-semiconductor field effect transistor (MOSFET) switching devices, two conventionally well-known MOS gate structures are the planar gate structure (in which a planar MOS gate is formed on a semiconductor substrate) and the trench gate structure (in which a MOS gate is buried within a trench formed in a semiconductor substrate).

In recent vertical power semiconductor devices, the trench gate structure has attracted attention. In the trench gate structure, the channel is formed orthogonal to the substrate front surface, thereby making it possible to reduce the cell width to a greater extent than in the planar gate structure, in which the channel is formed parallel to the substrate front surface. This makes it possible to increase the cell density per unit area and thus makes it possible to increase the current density per unit area, which is advantageous from a cost perspective.

For these reasons, the trench gate structure has gradually become more common than the planar gate structure even in silicon vertical MOSFETs. Therefore, similar to in silicon vertical MOSFETs, there is demand to ultimately use the trench gate structure in silicon carbide vertical MOSFETs.

However, using the trench gate structure in silicon carbide vertical MOSFETs typically results in a more significant decrease in channel mobility than in silicon vertical MOSFETs due to the negative effects of residual carbon (C) near the channel as well as the difficulty of forming the trench gate structure itself. This increases the channel resistance and reduces the advantages of using silicon carbide over using silicon. Strategies for reducing the channel resistance include decreasing the channel length as well as decreasing the impurity concentration of the portions of the base region that run along the sidewalls of the trench where the channel forms in order to facilitate inversion of the channel polarity, for example. However, decreasing the channel length reduces the distance between the drift region and the source region, which can potentially make the device more prone to punchthrough (a phenomenon in which current flows between the source and drain when no gate voltage is applied) and reduce the breakdown voltage (withstand voltage).

Moreover, decreasing the impurity concentration of the base region makes it easier for the majority carrier depletion layer (channel) to expand into the base region from the boundary between the gate insulating film and the base region when a gate voltage is applied. This reduces the strength of the electric field applied to the channel, which makes it more difficult to increase the minority carrier density in the channel; means that a higher gate voltage must be applied in order to increase the minority carrier density in the channel and invert the polarity of the channel; and reduces the decrease in gate threshold voltage achieved by decreasing the impurity concentration of the base region. In other words, when focusing on gate threshold voltage, to increase the gate threshold voltage, the impurity concentration of the base region must be sufficiently increased, which can result in an excessive increase in channel resistance. Meanwhile, when decreasing the gate threshold voltage, an excessive decrease in the impurity concentration of the base region can potentially result in a decrease in breakdown voltage. Here, "breakdown voltage" refers to the voltage at which avalanche breakdown occurs.

One example of a previously proposed silicon carbide vertical trench gate MOSFET is an n-channel MOSFET in which a high electron mobility n-type region is formed along the inner walls of the trench to reduce channel resistance (see Patent Document 1 (paragraph [0032] and FIG. 1), for example). In Patent Document 1, the portions of the p-type base region that run along the sidewalls of the trench (which contribute to determining the gate threshold voltage) are converted to n-type to reduce the channel resistance.

Another example of a previously proposed silicon carbide vertical trench gate MOSFET is a device in which silicon carbide is used as the semiconductor material, the width of p-type base regions sandwiched between adjacent trenches is decreased, and the impurity concentration of those p-type base regions is also decreased (see Patent Document 2 (paragraphs [0033] to [0034 and FIGS. 1 to 3), for example). In Patent Document 2, decreasing the width of the p-type base regions inhibits expansion of the majority carrier depletion layers and thereby prevents a decrease in breakdown voltage.

RELATED ART DOCUMENTS

Patent Documents

Patent Document 1: Japanese Patent No. 4678902
Patent Document 2: Japanese Patent Application Laid-Open Publication No. 2011-023675

SUMMARY OF THE INVENTION

However, when setting the impurity concentration of the portions of the p-type base region that run along the sidewalls of the trench to a low value, or when forming n-type structures using ion implantation as in Patent Document 1, if n-type impurities are ion-implanted from a direction orthogonal to the substrate front surface, the amount of n-type impurities implanted in the sidewalls of the trench is small, and the implantation depth of those n-type impurities is shallow. Therefore, to achieve an adequate implantation dose and implantation depth for the n-type impurities, the n-type impurities must be ion-implanted in the sidewalls of the trench from a slanted direction relative to the substrate front surface. However, this requires the ion implantation process to be performed at different implantation angles for each sidewall of the trench, which creates a new problem in terms of increasing the number of required ion implantation steps.

Moreover, in Patent Document 1, an n-type region is formed along the bottom of the trench, which increases the concentration of n-type impurities at the bottom of the trench. This causes the electric field to concentrate more strongly at the bottom of the trench when the MOSFET is OFF and can potentially result in a decrease in breakdown voltage due to dielectric breakdown in the portion of the gate insulating film that runs along the bottom of the trench. In Patent Document 2, it is more difficult to form the MOS gate structures in the narrower gaps between the trenches. Furthermore, the bottom of each trench is positioned further towards the drain side than the p-n junction between the base region and the drift region, which causes electric fields to concentrate more strongly at the bottom of the trench when the MOSFET is OFF and can potentially result in a decrease in breakdown voltage due to dielectric breakdown of the gate insulating film at the bottom of the trench.

The present invention was made to solve such problems in the conventional technologies described above and aims to provide a semiconductor device and a method of manufacturing the semiconductor device that make it possible to manufacture the device easily and also make it possible to set a prescribed gate threshold voltage while maintaining the breakdown voltage. Accordingly, the present invention is directed to a scheme that substantially obviates one or more of the problems due to limitations and disadvantages of the related art.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides a semiconductor device, including: a semiconductor substrate made of a semiconductor having a wider bandgap than silicon; a first semiconductor layer of a first conductivity type formed on a front surface of the semiconductor substrate; a second semiconductor layer of a second conductivity type formed on a surface of the first semiconductor layer on a side opposite to the semiconductor substrate; a first semiconductor region of the first conductivity type selectively formed within the second semiconductor layer; a trench that goes through the first semiconductor region and the second semiconductor layer in a depth direction and reaches the first semiconductor layer; a gate electrode formed within the trench with a gate insulating film interposed between the gate electrode and an inner surface of the trench; a second semiconductor region of the second conductivity type that is formed separated from the trench, goes through the second semiconductor layer in the depth direction and reaches the first semiconductor layer, and has a greater impurity concentration than the second semiconductor layer; a third semiconductor region of the second conductivity type that is formed within the first semiconductor layer separated from the second semiconductor layer and the second semiconductor region, covers a bottom of the trench, and has a greater impurity concentration than the second semiconductor layer; a first electrode that is electrically connected to the first semiconductor region and the second semiconductor layer; and a second electrode formed on a rear surface of the semiconductor substrate.

Moreover, in the semiconductor device according to one aspect of the present invention as described above, a width of the second semiconductor region may be less than a width of the trench.

Furthermore, in the semiconductor device according to one aspect of the present invention as described above, a bottom of the second semiconductor region facing the second electrode may be positioned closer to the second electrode in depth than the bottom of the trench.

In addition, the semiconductor device according to one aspect of the present invention as described above may further include a fourth semiconductor region of the second conductivity type that is selectively formed within the second semiconductor layer and has a greater impurity concentration than the second semiconductor region, wherein the first electrode contacts the first semiconductor region and the fourth semiconductor region, and wherein the second semiconductor region is formed on a side of the fourth semiconductor region facing the second electrode and contacts the fourth semiconductor region.

Moreover, the semiconductor device according to one aspect of the present invention as described above may further include a fourth semiconductor region of the second conductivity type formed within the first semiconductor layer on a side of the second semiconductor region facing the second electrode.

Furthermore, in the semiconductor device according to one aspect of the present invention as described above, a width of the fourth semiconductor region may be greater than the width of the second semiconductor region.

In addition, in the semiconductor device according to one aspect of the present invention as described above, the fourth semiconductor region may cover a bottom of the second semiconductor region facing the second electrode.

Moreover, in the semiconductor device according to one aspect of the present invention as described above, the trench may be formed in a linear layout that extends parallel to the front surface of the semiconductor substrate, and the second semiconductor region and the fourth semiconductor region may be formed in linear layouts parallel to a direction in which the trench linearly extends.

Furthermore, in the semiconductor device according to one aspect of the present invention as described above, the trench may be formed in a linear layout that extends parallel to the front surface of the semiconductor substrate, the second semiconductor region may be formed in a linear layout parallel to a direction in which the trench linearly extends, and the fourth semiconductor region may be arranged in a plurality at a prescribed interval in a direction in which the second semiconductor region linearly extends.

In addition, in the semiconductor device according to one aspect of the present invention as described above, an impurity concentration of the fourth semiconductor region may be greater than the impurity concentration of the second semiconductor region.

Moreover, in the semiconductor device according to one aspect of the present invention as described above, the second semiconductor region may be an epitaxial layer.

Furthermore, in the semiconductor device according to one aspect of the present invention as described above, the third semiconductor region may be an epitaxial layer.

In addition, in the semiconductor device according to one aspect of the present invention as described above, the semiconductor having a wider bandgap than silicon may be silicon carbide.

Moreover, in the semiconductor device according to one aspect of the present invention as described above, a surface of the second semiconductor layer on a side opposite to the first semiconductor layer may be a (0001) plane, and sidewalls of the trench may be {1-100} planes.

Furthermore, in the semiconductor device according to one aspect of the present invention as described above, the second semiconductor layer may have a second conductivity type impurity concentration profile that exhibits a Gaussian distribution with differing impurity concentrations from high to low in the depth direction from a position that has a highest impurity concentration.

Moreover, in order to solve the abovementioned problems and achieve the abovementioned objectives, in another aspect, the present disclosure provides a method of manufacturing a semiconductor device, including: a first step of epitaxially growing a first semiconductor layer of a first conductivity type on a front surface of a semiconductor substrate made of a semiconductor having a wider bandgap than silicon; a second step of epitaxially growing a second semiconductor layer of a second conductivity type on the first semiconductor layer; a third step of forming, separated from one another, first trenches that go through the second semiconductor layer in a depth direction and reach the first semiconductor layer, and second trenches that are narrower than the first trenches and go through the second semiconductor layer in the depth direction and reach the first semiconductor layer; a fourth step of epitaxially growing a third semiconductor layer of the second conductivity type at a greater impurity concentration than the second semiconductor layer along a surface of the second semiconductor layer and inner walls of the first trenches, the third semiconductor layer completely filling in the second trenches; a fifth step of removing portions of the third semiconductor layer on sidewalls of the first trenches to expose the first semiconductor layer and the second semiconductor layer to the sidewalls of the first trenches, leaving portions of the third semiconductor layer at respective bottoms of the first trenches; a sixth step of selectively forming, in the third semiconductor layer remaining between the first trenches that are adjacent to one another, first semiconductor regions of the first conductivity type that are exposed to the respective sidewalls of the first trenches and reaches the second semiconductor layer; a seventh step of forming a gate insulating film along the sidewalls of the first trenches and on surfaces of the portions of the third semiconductor layer remaining at the respective bottoms of the first trenches; an eighth step of forming gate electrodes on the gate insulating film inside of the first trenches; a ninth step of forming a first electrode that electrically connects to the respective first semiconductor regions and the third semiconductor layer; and a tenth step of forming a second electrode on a rear surface of the semiconductor substrate.

Moreover, in the method of manufacturing the semiconductor device according to one aspect of the present invention as described above, in the third step, the first trenches may be formed such that the sidewalls are crystal planes with a faster oxidation speed than the front surface of the semiconductor substrate, and in the fifth step, the portions of the third semiconductor layer on the sidewalls of the first trenches may be oxidized to form an oxide film, and this oxide film may be removed to expose the first semiconductor layer and the second semiconductor layer to the sidewalls of the first trenches.

Furthermore, in the method of manufacturing the semiconductor device according to one aspect of the present invention as described above, the front surface of the semiconductor substrate may be a (0001) plane, and in the third step, the first trenches may be formed such that the sidewalls are {1-100} planes.

In addition, the method of manufacturing the semiconductor device according to one aspect of the present invention as described above may further include after the fifth step but before the seventh step, an eleventh step of selectively forming, in the third semiconductor layer remaining between the first trenches that are adjacent to one another, second semiconductor regions of the second conductivity type that reach the second semiconductor layer, wherein in the eleventh step, the second semiconductor regions are formed in the third semiconductor layer at positions facing the respective second trenches in the depth direction, and wherein in the ninth step, the first electrode is formed contacting the respective first semiconductor regions and the respective second semiconductor regions.

Moreover, the method of manufacturing the semiconductor device according to one aspect of the present invention as described above may further include after the first step but before the second step, a twelfth step of selectively forming second semiconductor regions of the second conductivity type in a surface layer of the first semiconductor layer, wherein in the third step, the second trenches are formed going through the second semiconductor layer in the depth direction and reaching the respective second semiconductor regions.

Furthermore, in the method of manufacturing the semiconductor device according to one aspect of the present invention as described above, a width of the second semiconductor regions may be greater than a width of the second trenches.

In addition, in the method of manufacturing the semiconductor device according to one aspect of the present invention as described above, the semiconductor having a wider bandgap than silicon may be silicon carbide.

In the invention described above, expansion of the channel that forms when a gate voltage is applied is inhibited, thereby making it possible to appropriately set a prescribed gate threshold voltage according to the impurity concentration of the base region (the second semiconductor layer). Moreover, the second semiconductor region between adjacent gate trenches and the third semiconductor region at the bottom of the gate trench make it possible to reduce the strength of the electric field at the bottom of the gate trench. Furthermore, the invention described above makes it possible to easily form highly crystalline second and third semiconductor regions without using ion implantation.

The semiconductor device and method of manufacturing the semiconductor device according to the present invention make it possible to manufacture the device easily and also make it possible to set a prescribed gate threshold voltage while maintaining the breakdown voltage. It is to be understood that both the foregoing general description and the following detailed description are exemplary and explanatory, and are intended to provide further explanation of the invention as claimed.

DETAILED DESCRIPTION OF EMBODIMENTS

Figure 1:
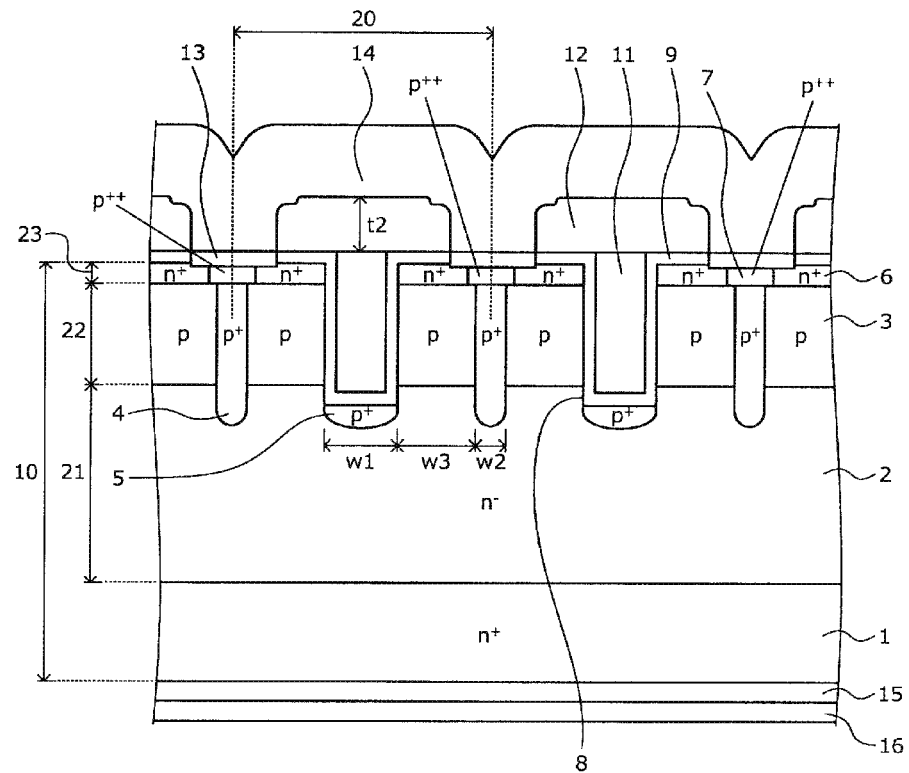
FIG. 1 is a cross-sectional view illustrating the structure of a semiconductor device according to Embodiment 1.

Preferred embodiments of a semiconductor device and a method of manufacturing the semiconductor device according to the present invention will be described in detail below with reference to the attached drawings. In the present specification and the attached drawings, the letters "n" and "p" are used to indicate whether the majority carriers in a layer or region are electrons or holes, respectively. Moreover, the symbols + and − are appended to the letters n and p to indicate layers or regions having a higher or lower impurity concentration, respectively, than layers or regions in which the + and − symbols are not appended. In the descriptions of the embodiments and the attached drawings, the same reference characters are used to indicate components that are the same, and redundant descriptions of the same components are omitted. Furthermore, the following notation is used for Miller indices in the present specification: the symbol − indicates a bar to be applied to the immediately following index that follows the − symbol; that is, the symbol − is inserted before an index to indicate that that index is negative.

(Embodiment 1)

A semiconductor device according to the present invention is made using a semiconductor that has a wider bandgap than silicon (Si) (hereinafter, a "wide-bandgap semiconductor") as the semiconductor material. Here, the structure of a semiconductor device according to Embodiment 1 and illustrated in FIG. 1 will be described using, as an example, an enhancement-mode (normally-off) vertical MOSFET produced (manufactured) using silicon carbide (SiC) as the wide-bandgap semiconductor (hereinafter, an "SiC vertical MOSFET"). FIG. 1 is a cross-sectional view illustrating the structure of the semiconductor device according to Embodiment 1.

The semiconductor device according to Embodiment 1 and illustrated in FIG. 1 is an SiC vertical MOSFET that includes MOS gates that have the trench gate structure and are formed on the front surface side of a silicon carbide substrate (semiconductor chip) 10. The silicon carbide substrate 10 is an epitaxial substrate in which silicon carbide layers (first to third semiconductor layers) 21 to 23 that have prescribed conductivity types and impurity concentrations are epitaxially grown in order on the front surface of an n$^+$ starting substrate (semiconductor substrate) 1. The n$^+$ starting substrate 1 is an n$^+$ drain region. The n$^-$ silicon carbide layer 21 is an n$^-$ drift region 2. The p-type silicon carbide layer 22 is a p-type base region 3.

FIG. 1 illustrates two unit cells (the functional unit for elements) 20 in an active region but does not show the other unit cells that are adjacent to these unit cells or an edge termination region that surrounds the periphery of the active region. The active region is the region through which current flows when the device is in the ON state. The edge termination region is a region between the active region and the edges of the chip that maintains the breakdown voltage by reducing the strength of the electric field on the front surface (hereinafter, "substrate front surface") side of the silicon carbide substrate 10. Breakdown structures such as a guard ring, a junction termination extension (JTE) structure, a RESURF portion, or a field plate are arranged in the edge termination region.

In the active region, MOS gates for the unit cells 20 are formed on the substrate front surface side (that is, on the surface on the silicon carbide layer 23 side). The MOS gate in each unit cell 20 includes a p-type base region 3, first and second p$^+$ regions (second and third semiconductor regions) 4 and 5, an n$^+$ source region (first semiconductor region) 6, a p$^{++}$ contact region (fourth semiconductor region) 7, a trench (hereinafter, a "gate trench") 8, a gate insulating film 9, and a gate electrode 11. The p-type base region 3 is the p-type silicon carbide layer 22 that is epitaxially grown on the n$^-$ silicon carbide layer 21 as described above. The p-type base region 3 may have a Gaussian distribution-shaped p-type impurity concentration profile in the depth direction that is formed by ion-implanting p-type impurities (that is, with different impurity concentrations moving in the depth direction from a position at which the concentration of p-type impurities is greatest).

The p$^+$ silicon carbide layer 23 is epitaxially grown on the p-type silicon carbide layer 22 to form the first and second p$^+$ regions 4 and 5 (described below). The n$^+$ source region 6 and the p$^{++}$ contact region 7 are both selectively formed within the p$^+$ silicon carbide layer 23. The n$^+$ source region 6 and the p$^{++}$ contact region 7 go through the p$^+$ silicon carbide layer 23 in the depth direction (the direction going from the substrate front surface towards the substrate rear surface; the vertical direction) and reach the p-type silicon carbide layer 22. The n$^+$ source region 6 and the p$^{++}$ contact region 7 contact one another. The p$^{++}$ contact region 7 reduces the contact resistance with a source electrode (first electrode) 13.

The gate trench 8 goes through the n$^+$ source region 6 and the p-type base region 3 and reaches the n$^-$ drift region 2. The region between the centers of the portions (mesa portions) between adjacent gate trenches 8 corresponds to a single one of the unit cells 20. The gate insulating film 9 is formed along the inner walls of the gate trench 8. The gate electrode 11 is formed on the gate insulating film 9 inside of the gate trench 8. The gate electrode 11 sandwiches the gate insulating film 9 along the sidewalls of the gate trench 8 and faces the n$^+$ source region 6, the p-type base region 3, and the n$^-$ drift region 2. The gate electrode 11 is electrically insulated from the n$^-$ drift region 2, the p-type base region 3, the second p$^+$ region 5, and the n$^+$ source region 6 by the gate insulating film 9. The end of the gate electrode 11 on the substrate front surface side may protrude out from the gate trench 8.

The gate electrode 11 (that is, the gate trench 8) is arranged in a stripe-shaped (straight line-shaped) planar layout that extends parallel to the substrate front surface, for example. In this case, the regions between adjacent gate trenches 8 (the p-type base region 3, the first p$^+$ region 4, the n$^+$ source region 6, and the p$^{++}$ contact region 7) and the second p$^+$ regions 5 directly beneath (on the drain side of) the gate trenches 8 are also arranged in straight line-shaped planar layouts that are parallel to the direction in which the stripe-shaped gate electrodes 11 extend (that is, the direction going into the page in FIG. 1). Here, "planar layout" refers to the planar shape and arrangement of the components as viewed from the front surface side of the silicon carbide substrate 10.

The first p$^+$ region 4 goes from the substrate front surface side through the p-type silicon carbide layer 22 in the depth direction and reaches the n$^-$ drift region 2. Moreover, the first p$^+$ region 4 is formed directly beneath the p$^{++}$ contact region 7. It is preferable that the first p$^+$ region 4 contact the p$^{++}$ contact region 7. The first p$^+$ region 4 may also contact the n$^+$ source region 6. Furthermore, the first p$^+$ region 4 is arranged separated from the gate trench 8. The first p$^+$ region 4 may be arranged near the center position between adjacent gate trenches 8, for example. The width w2 of the first p$^+$ region 4 is less than the width w1 of the gate trench 8 (that is, w2<w1). Here, the "widths" w1 and w2 refer to the widths in the direction (widthwise direction) that is orthogonal to the direction in which the gate trench 8 extends in a stripe shape (this also applies to the cell width and the widths w3 and w4 described below).

The drain-side end of the first p$^+$ region 4 may be positioned further towards the drain side than the bottom of the gate trench 8 and may also be positioned further towards the drain side than the drain-side end of the second p$^+$ region 5, for example. FIG. 1 illustrates a case in which the drain-side ends of the first and second p$^+$ regions 4 and 5 are positioned at the same depth. Positioning the drain-side end of the first p$^+$ region 4 further towards the drain side than the bottom of the gate trench 8 makes the electric field concentrate more readily at the drain-side end of the first p$^+$ region 4 than at the bottom of the gate trench 8 when the MOSFET is OFF, thereby maintaining the breakdown voltage (withstand voltage).

The first p$^+$ region 4 is constituted by an epitaxial layer (the p$^+$ silicon carbide layer 23), for example. The impurity concentration of the first p$^+$ region 4 is greater than the impurity concentration of the p-type base region 3. The impurity concentration of the first p$^+$ region 4 is set to a value that is approximately an order of magnitude greater than the impurity concentration of the p-type base region 3, for example, and can be set within the range that is achievable in an epitaxial layer (such as less than or equal to approximately $1 \times 10^{18}$/cm$^3$). Setting the impurity concentration of the first p$^+$ region 4 to be greater than the impurity concentration of the p-type base region 3 makes it possible to adjust the gate threshold voltage according to the impurity concentration of the p-type base region 3.

More specifically, the first p$^+$ region 4 inhibits expansion of the majority carrier (hole) depletion layer that expands into the p-type base region 3 from the boundary between the gate insulating film 9 and the p-type base region 3 when a voltage of greater than or equal to the gate threshold voltage is applied to the gate electrode 11 while a positive voltage relative to the source electrode 13 is applied to a drain electrode (second electrode) 15. This hole depletion layer (region in which holes are depleted) is the channel that forms in the portions of the p-type base region 3 that run along the sidewalls of the gate trench 8. In the state of thermal equilibrium in which no gate voltage is applied, the channel only contains a small number of minority carriers (electrons) and has exceptionally low conductivity.

This channel expands into the p-type base region 3 when a positive gate voltage is applied, but this expansion is inhibited by the first p$^+$ region 4. This, in comparison to conventional structures that do not include the first p$^+$ region 4, increases the strength of the electric field applied to the channel and makes it easier for the lower end of the conduction band of the semiconductor surface (that is, the channel portions in the p-type base region 3) of the MOS gate to approach the Fermi level, which makes it easier to increase the electron density within the channel and thereby makes it easier increase the conductivity of the channel (that is, easier to invert the polarity of the channel to n-type). Therefore, even when the impurity concentration of the p-type base region 3 is reduced, the polarity of the channel can still be inverted to n-type at the gate threshold voltage that can theoretically be achieved when using that impurity concentration for the p-type base region 3.

In this way, the gate threshold voltage can be set as desired according to the impurity concentration of the p-type base region 3. Even if the impurity concentration of the p-type base region 3 is decreased, for example, the first p$^+$ region 4 (as described above) and the second p$^+$ region 5 (as described below) make it possible to prevent a decrease in the breakdown voltage. Therefore, by appropriately adjusting the impurity concentration of the p-type base region 3 as described above, a prescribed gate threshold voltage can be set while also maintaining the breakdown voltage. More specifically, the gate threshold voltage is determined by the impurity concentration of the p-type base region 3, the impurity concentration of the first p$^+$ region 4, the width w3 from the sidewall of the gate trench 8 to the first p$^+$ region 4, and the thickness of the gate insulating film, for example.

The second p$^+$ region 5 is formed within the n$^-$ drift region 2 and covers the entire bottom surface of the gate trench 8. Moreover, the second p$^+$ region 5 is arranged separated from the p-type base region 3 and the first p$^+$ region 4. The second p$^+$ region 5 may partially contact the p-type base region 3. The second p$^+$ region 5 is constituted by an epitaxial layer (the p$^+$ silicon carbide layer 23), for example. The impurity concentration of the second p$^+$ region 5 is greater than the impurity concentration of the p-type base region 3. The impurity concentration of the second p$^+$ region 5 is set to be approximately equal to the impurity concentration of the first p$^+$ region 4, for example. The second p$^+$ region 5 reduces the strength of the electric field applied to the bottom of the gate trench 8 when the MOSFET is off and thus contributes to maintaining the breakdown voltage.

An interlayer insulating film 12 is formed spanning over the entire substrate front surface from the active region to the edge termination region and covering the gate electrode 11. The source electrode 13 contacts the n$^+$ source region 6 and the p$^{++}$ contact region 7 via a contact hole formed in the interlayer insulating film 12 and is thus electrically connected to the p-type base region 3, the first p$^+$ region 4, the n$^+$ source region 6, and the p$^{++}$ contact region 7. The source electrode 13 is electrically insulated from the gate electrode 11 by the interlayer insulating film 12. The source electrode 13 may be formed just within the contact hole.

A source pad (electrode pad) 14 is formed on the interlayer insulating film 12 and the source electrode 13 so as to fill in the contact hole. The source pad 14 is electrically connected to the source electrodes 13 of all of the unit cells 20. The drain electrode 15 is formed spanning over the entire rear surface of the silicon carbide substrate 10 (that is, the rear surface of the n$^+$ starting substrate 1). A drain pad 16 (electrode pad) 16 is formed on the surface of the drain electrode 15.

Next, a method of manufacturing the semiconductor device according to Embodiment 1 will be described. FIGS. 2 to 6 are cross-sectional views illustrating states of the semiconductor device according to Embodiment 1 while being manufactured. First, an n$^+$ monocrystalline substrate doped with n-type impurities such as nitrogen (N) is prepared as the n+ starting substrate (starting wafer) 1, for example. The front surface of the n+ starting substrate 1 may be the (0001) plane (the so-called Si plane), for example. Next, the n− silicon carbide layer 21 (which is doped with n-type impurities such as nitrogen, for example) is epitaxially grown on the front surface of the n+ starting substrate 1. The thickness of the n− silicon carbide layer 21 may be 10 µm, for example.

Figure 2:
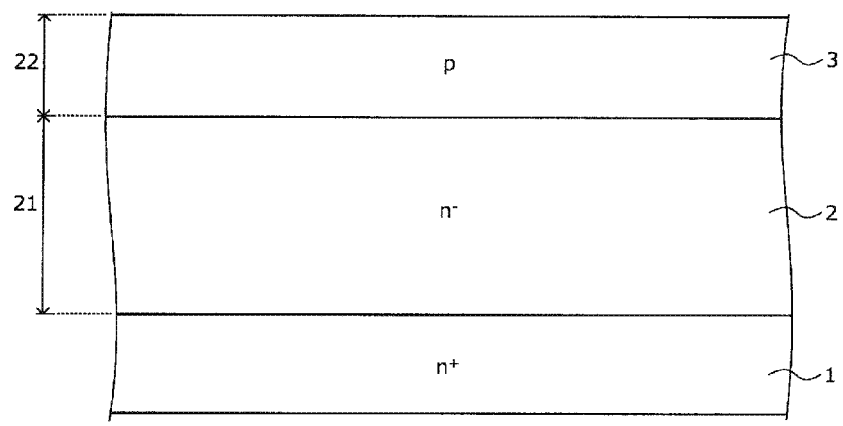
FIG. 2 is a cross-sectional view illustrating a state of the semiconductor device according to Embodiment 1 while being manufactured.

Next, the p-type silicon carbide layer 22 (which is doped with p-type impurities such as aluminum (Al), for example) is epitaxially grown on the surface of the n− silicon carbide layer 21. The thickness and impurity concentration of the p-type silicon carbide layer 22 may respectively be approximately 1.5 µm and approximately $5 \times 10^{15}/cm^3$, for example. FIG. 2 illustrates the state of the device up to this point.

Next, using photolithography technology, an etching mask (not illustrated in the figures) in which openings are formed in portions corresponding to formation regions for the gate trenches 8 and the first p+ regions 4 is formed on the surface of the p-type silicon carbide layer 22. An oxide film ($SiO_2$) mask may be used for this etching mask, for example. Then, an etching process is performed using this etching mask as a mask in order to form first and second trenches 31 and 32 that go through the p-type silicon carbide layer 22 in the depth direction and reach the n− silicon carbide layer 21. This etching process may be a dry etching process, for example. The portion of the n− silicon carbide layer 21 other than the first and second trenches 31 and 32 becomes the n− drift region 2. The portions of the p-type silicon carbide layer 22 other than the first and second trenches 31 and 32 become the p-type base regions 3.

Figure 3:
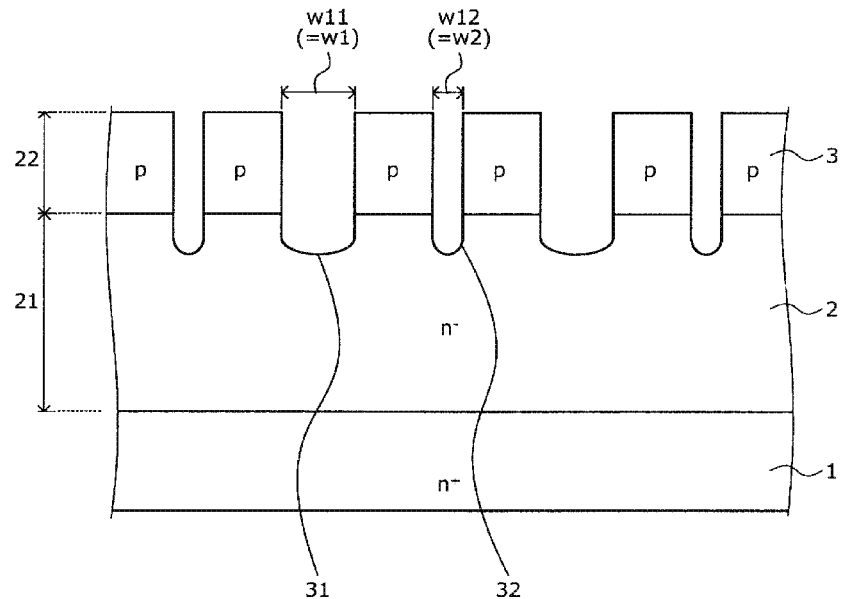
FIG. 3 is a cross-sectional view illustrating a state of the semiconductor device according to Embodiment 1 while being manufactured.

The first and second trenches 31 and 32 are arranged separated from one another and repeating in an alternate manner in a direction (the horizontal direction) parallel to the substrate front surface. The width w11 of the first trenches 31 is equal to the w1 of the gate trenches 8 and may be approximately 1.5 µm, for example. The width w12 of the second trenches 32 is equal to the w2 of the first p+ regions 4 and may be approximately 0.5 µm, for example. Moreover, the first and second trenches 31 and 32 may be formed such that an m-plane is exposed along the sidewalls thereof, for example. Here, "m-plane" is a general term for {1-100} planes that are orthogonal to the (000-1) plane (the so-called c-plane). More specifically, "m-plane" refers to the (10-10) plane, the (-1010) plane, the (1-100) plane, the (-1100) plane, the (01-10) plane, and the (0-110) plane. Then, the etching mask used to form the first and second trenches 31 and 32 is removed. FIG. 3 illustrates the state of the device up to this point.

Figure 4:
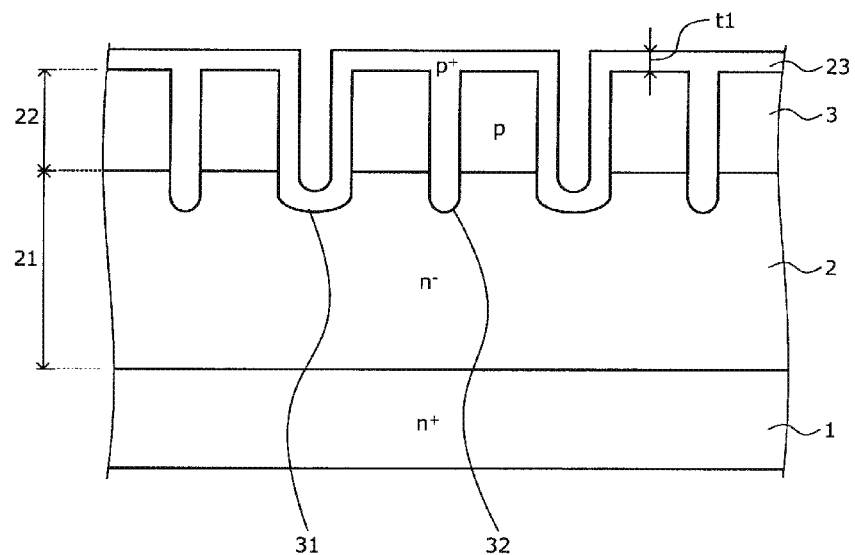
FIG. 4 is a cross-sectional view illustrating a state of the semiconductor device according to Embodiment 1 while being manufactured.

Next, the p+ silicon carbide layer 23 (which is doped with p-type impurities such as aluminum, for example) is epitaxially grown on the surface of the p-type silicon carbide layer 22 and along the inner walls of the first trenches 31. Here, the thickness t1 of the p+ silicon carbide layer 23 is set to be greater than or equal to half of the width w12 of the second trenches 32 (that is, w12/2<t1) so that the p+ silicon carbide layer 23 completely fills in the second trenches 32. The thickness t1 and impurity concentration of the p+ silicon carbide layer 23 may respectively be approximately 0.3 µm and approximately $5 \times 10^{17}/cm^3$, for example. The steps thus far produce the silicon carbide substrate (semiconductor wafer) 10 in which the n− silicon carbide layer 21, the p-type silicon carbide layer 22, and the p+ silicon carbide layer 23 are layered in order on the front surface of the n+ starting substrate 1. FIG. 4 illustrates the state of the device up to this point.

Next, taking advantage of the fact that the oxidation speed of silicon carbide differs by crystal plane, the p+ silicon carbide layer 23 is selectively oxidized. More specifically, using a wet oxidation process, for example, the portions of the p+ silicon carbide layer 23 arranged along the sidewalls (m-planes) of the first trenches 31 are completely oxidized. The portions of the p+ silicon carbide layer 23 that are filled into the second trenches 32 are not exposed to the water ($H_2O$)-containing atmosphere (steam), for example, used in the wet oxidation process and therefore are not oxidized. The portions of the p+ silicon carbide layer 23 on the surface of the p-type silicon carbide layer 22 and on the bottom surfaces of the first trenches 31 oxidize at the oxidation speed of the respective crystal plane (the Si plane). However, in silicon carbide, oxidation along the m-plane proceeds more quickly than oxidation along the Si plane, and therefore a portion of the p+ silicon carbide layer 23 remains unoxidized along the Si plane.

Next, using an etching process, for example, the oxidized portion of the p+ silicon carbide layer 23 (that is, the oxide film) is removed. This leaves the p+ silicon carbide layer 23 remaining only on the surface of the p-type silicon carbide layer 22, on the bottom surfaces of the first trenches 31, and inside the second trenches 32. The portions of the p+ silicon carbide layer 23 remaining inside the second trenches 32 are the first p+ regions 4. The portions of the p+ silicon carbide layer 23 remaining on the bottom surfaces of the first trenches 31 are the second p+ regions 5. The n− drift region 2 and the p-type base regions 3 are exposed along the sidewalls of the first trenches 31. The surfaces of the second p+ regions 5 become the bottom surfaces of the gate trenches 8, and the exposed sidewalls of the first trenches 31 become the sidewalls of the gate trenches 8.

Next, using a photolithography technology, an ion implantation mask (not illustrated in the figures) in which openings are formed in portions corresponding to formation regions for the n+ source regions 6 is formed on the front surface of the silicon carbide substrate 10 (the surface of the p+ silicon carbide layer 23). The ion implantation mask fills in the first trenches 31. An oxide film mask may be used for this ion implantation mask, for example. Then, using this ion implantation mask as a mask, n-type impurities such as phosphorus (P) are ion-implanted, for example. Here, the dose of ion-implanted n-type impurities is set to be greater than the concentration of p-type impurities in the p+ silicon carbide layer 23 in order to invert the conductivity type of portions of the p+ silicon carbide layer 23 to n-type. The implantation depth for the ion-implanted n-type impurities is set to be greater than or equal to the thickness t1 of the portions of the p+ silicon carbide layer 23 remaining on the surface of the p-type silicon carbide layer 22. In this way, the n+ source regions 6 are selectively formed in the portions of the p+ silicon carbide layer 23 remaining on the surface of the p-type silicon carbide layer 22. Then, the ion implantation mask used to form the n+ source regions 6 is removed.

Next, using a photolithography technology, an ion implantation mask (not illustrated in the figures) in which openings are formed in portions corresponding to formation regions for the p++ contact regions 7 is formed on the front surface of the silicon carbide substrate 10 (the surface of the p+ silicon carbide layer 23). The ion implantation mask fills in the first trenches 31. An oxide film mask may be used for this ion implantation mask, for example. Then, using this ion implantation mask as a mask, p-type impurities such as aluminum are ion-implanted, for example. Here, the implantation depth for the ion-implanted p-type impurities is set to be greater than or equal to the thickness t1 of the portions of the p$^+$ silicon carbide layer 23 remaining on the surface of the p-type silicon carbide layer 22. This ion implantation of additional p-type impurities into the p$^+$ silicon carbide layer 23 results in the concentration of p-type impurities becoming even higher in certain portions of the p$^+$ silicon carbide layer 23. In this way, the p$^{++}$ contact regions 7 are selectively formed in the portions of the p$^+$ silicon carbide layer 23 remaining on the surface of the p-type silicon carbide layer 22. Then, the ion implantation mask used to form the p$^{++}$ contact regions 7 is removed. The order in which the n$^+$ source regions 6 and the p$^{++}$ contact regions 7 are formed may be reversed.

Figure 5:
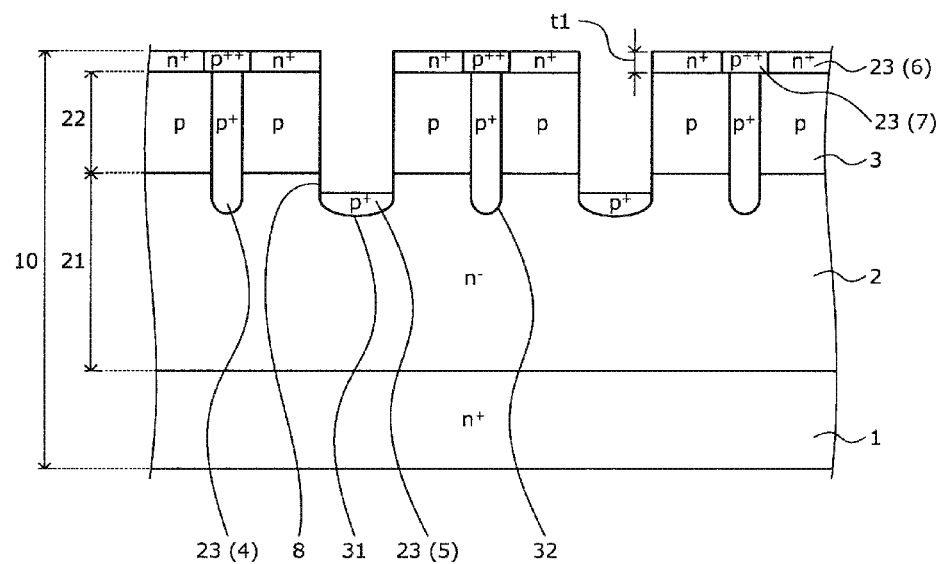
FIG. 5 is a cross-sectional view illustrating a state of the semiconductor device according to Embodiment 1 while being manufactured.

Next, a heat treatment (activation annealing) is performed to activate the n$^+$ source regions 6 and the p$^{++}$ contact regions 7. The temperature and treatment time for this heat treatment may respectively be set to approximately 1700° C. and approximately 2 minutes, for example. Moreover, a separate activation annealing process may be performed after each ion implantation process. FIG. 5 illustrates the state of the device up to this point.

Next, the gate insulating film 9 is formed along the front surface of the silicon carbide substrate 10 (the surfaces of the n$^+$ source regions 6 and the p$^{++}$ contact regions 7) and along the inner walls of the gate trenches 8 (the surfaces of the second p$^+$ regions 5 and the sidewalls of the first trenches 31). The gate insulating film 9 may be formed using a thermal oxidation process in which a heat treatment is performed in an oxygen ($O_2$) atmosphere at a temperature of approximately 1000° C., for example. Alternatively, the gate insulating film 9 may be a deposited oxide film deposited using a chemical reaction such as high temperature oxidation (HTO), for example.

Next, a polycrystalline silicon (poly-Si) layer doped with n-type impurities such as phosphorus, for example, is deposited on the gate insulating film 9 so as to fill in the gate trenches 8. Then, the polycrystalline silicon layer is patterned using a photolithography technology to leave portions of the polycrystalline silicon layer that then become the gate electrodes 11 remaining within the gate trenches 8. Portions of the gate electrodes 11 may protrude out (upwards) from the gate trenches 8.

Next, the interlayer insulating film 12 is formed covering the gate insulating film 9 and the gate electrodes 11. The interlayer insulating film 12 is made of phosphosilicate glass (PSG), borophosphosilicate glass (BPSG), or a combination of the two, for example. The thickness t2 of the portions of the interlayer insulating film 12 on the gate electrodes 11 may be 1 µm, for example.

Next, using a photolithography technology, the interlayer insulating film 12 and the gate insulating film 9 are patterned to form contact holes, thereby exposing the n$^+$ source regions 6 and the p$^{++}$ contact regions 7 within the contact holes. Then, the interlayer insulating film 12 is planarized using a heat treatment (reflow).

Next, using a sputtering process, for example, a metal film that will become the source electrodes 13 is formed on the surface of the interlayer insulating film 12 and along the contact holes. The metal film that will become the source electrodes 13 may be a nickel (Ni) film, for example. Then, using a photolithography and etching process, this metal film is selectively removed to leave the source electrodes 13 remaining only inside of the contact holes, for example.

Figure 6:
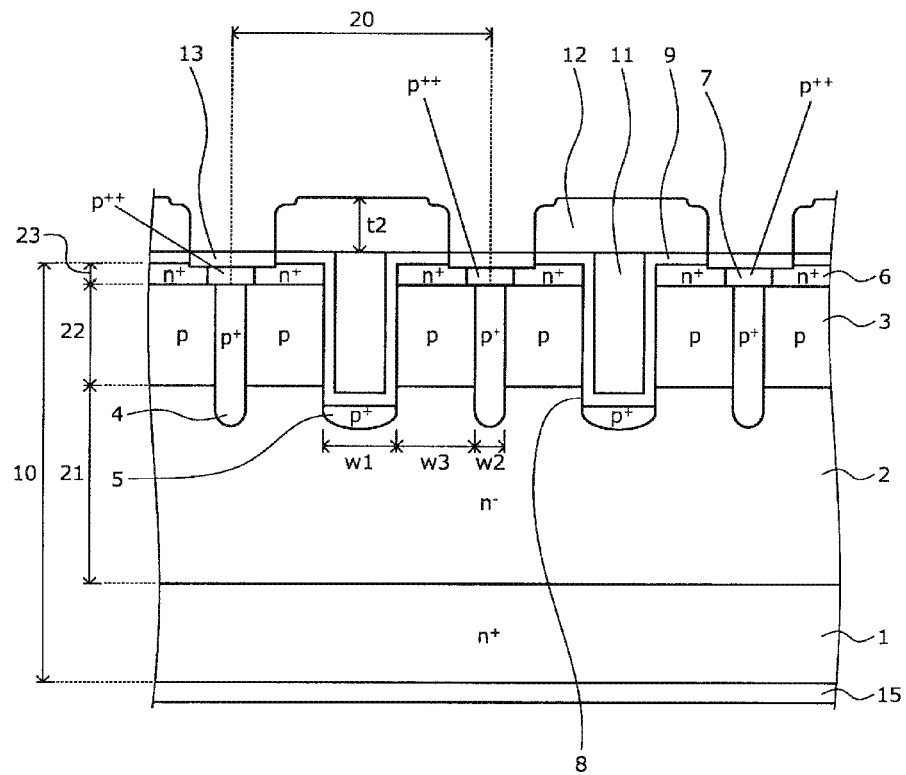
FIG. 6 is a cross-sectional view illustrating a state of the semiconductor device according to Embodiment 1 while being manufactured.

Next, a nickel (Ni) film, for example, that will become the drain electrode 15 is formed on the rear surface of the silicon carbide substrate 10 (the rear surface of the n$^+$ starting substrate 1). Then, a heat treatment is performed to cause a reaction between the silicon carbide substrate 10 and the metal films on both surfaces thereof, thereby forming the source electrodes 13 and the drain electrode 15 to be in ohmic contact within the silicon carbide substrate 10. FIG. 6 illustrates the state of the device up to this point.

Next, an aluminum film, for example, that has a thickness of approximately 5 µm and will become the source pad 14 is deposited covering the source electrodes 13 and the interlayer insulating film 12 using a sputtering process, for example. Then, the aluminum film in selectively removed to leave only the portion that becomes the source pad 14 remaining.

When forming the source pad 14, portions of the aluminum film may be left remaining to form gate pads (electrode pads; not illustrated in the figure). These gate pads are then electrically connected to the gate electrodes 11 of the unit cells 20.

Next, using a sputtering process, for example, a titanium (Ti) film, a nickel film, and a gold (Au) film, for example, are layered in that order on the surface of the drain electrode 15 to form the drain pad 16. Finally, the semiconductor wafer is diced into individual chips, thus completing the SiC vertical MOSFET illustrated in FIG. 1.

As described above, in the semiconductor device according to Embodiment 1, forming the first p$^+$ region that goes through the p-type base region in the depth direction and is separated from the gate trench inhibits expansion of the hole depletion layer (channel) that expands into the p-type base region from the boundary between the gate insulating film and the p-type base region when a positive gate voltage is applied. This, in comparison to conventional structures that do not include the first p$^+$ region, makes it easier to invert the polarity of the channel even when the impurity concentration of the p-type base region is reduced to decrease the channel resistance, for example, thereby making it possible to switch the MOSFET ON at the gate threshold voltage that can theoretically be achieved for the given impurity concentration in the p-type base region. This, in turn, makes it possible to appropriately set a prescribed gate threshold voltage (which is dependent on the impurity concentration of the p-type base region) as well as to decrease on-resistance.

Moreover, in the semiconductor device according to Embodiment 1, forming the first p$^+$ region increases the effective impurity concentration of the overall base region even when the impurity concentration of the p-type base region is reduced in order to set the gate threshold voltage to a prescribed value (such as approximately 5V). This prevents punchthrough and leakage currents due to the short-channel effect (a degradation phenomenon) and also makes it possible to prevent decreases in breakdown voltage. Furthermore, in the semiconductor device according to Embodiment 1, arranging the drain-side end of the first p$^+$ region to be further towards the drain side than the bottom of the gate trench and forming the second p$^+$ region at the bottom of the gate trench makes it possible to reduce electric field concentration at the bottom of the gate trench when the MOSFET is OFF. This makes it possible to prevent decreases in breakdown voltage.

In addition, the method of manufacturing the semiconductor device according to Embodiment 1 makes it possible to form the first p$^+$ regions between the gate trenches and the second p$^+$ regions at the bottoms of the gate trenches as epitaxial layers. This makes it possible to make the impurity concentration distributions of the first and second p$^+$ regions more uniform than when formed using ion implantation. Moreover, in the method of manufacturing the semiconductor device according to Embodiment 1, the first p$^+$ regions are formed by filling in the second trenches with a p+ epitaxial layer, thereby making it possible to make the width of the first p+ regions narrower than when formed using ion implantation. For example, the width of the first p+ regions can be set to less than or equal to 1 µm. This makes it possible to reduce the width of each cell, thereby making it possible to improve current capacity or to facilitate miniaturization of the semiconductor chip.

Note that if the first and second p+ regions were to be formed using ion implantation, the second p+ regions and portions of the first p+ regions would need to be formed by performing an ion implantation process on the n− silicon carbide layer that becomes the n− drift region. Next, the p-type silicon carbide layer that becomes the p-type base regions would be epitaxially grown on the n− silicon carbide layer, and the remaining portions of the first p+ regions would be formed by performing an ion implantation process on this p-type silicon carbide layer. Here, in order to form the remaining portions of the first p+ regions, the process of epitaxially growing a p-type silicon carbide layer and then performing ion implantation would need to be repeated at least twice because the p-type base regions are thick relative to the ion implantation depths that can be achieved in silicon carbide. Then, an etching process for forming the gate trenches would be performed. Therefore, forming the first and second p+ regions and the gate trenches would require two p-type silicon carbide layer epitaxial growth processes, three ion implantation processes, and the gate trench formation process, for a total of six processes.

In contrast, the method of manufacturing the semiconductor device according to Embodiment 1 makes it possible to easily form highly crystalline first and second p+ regions without using ion implantation. More specifically, the p-type silicon carbide layer that becomes the p-type base regions is epitaxially grown, the first and second trenches are formed, the p+ silicon carbide layer that becomes the first and second p+ regions is epitaxially grown, and then portions of the p+ silicon carbide layer are removed. This makes it possible to reduce the number of steps in comparison to forming the first and second p+ regions using ion implantation. Moreover, making the width of the second trenches less than the width of the first trenches and exposing crystal planes that exhibit faster oxidation speed than the substrate front surface along the sidewalls of the first trenches makes it possible to remove portions of the p+ silicon carbide layer using only a rapid oxidation process and an oxide film-removing process, thereby making it possible to easily leave the p+ silicon carbide layer that becomes the second and first p+ regions remaining at the respective prescribed locations in the first and second trenches.

(Embodiment 2)

Figure 7:
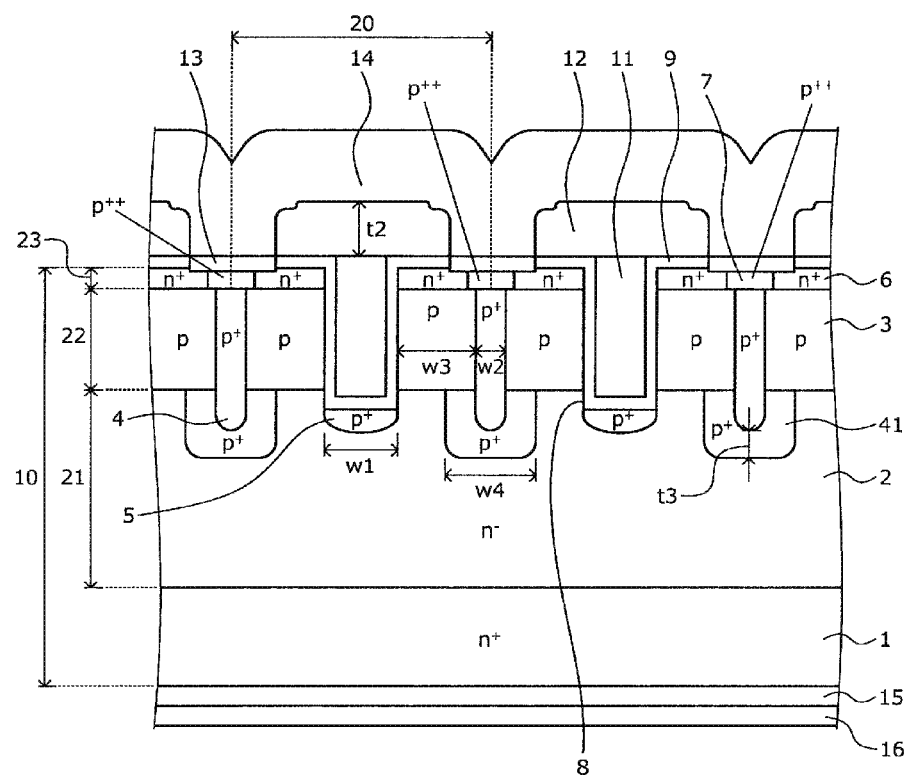
FIG. 7 is a cross-sectional view illustrating the structure of a semiconductor device according to Embodiment 2.

Next, the structure of a semiconductor device according to Embodiment 2 will be described. FIG. 7 is a cross-sectional view illustrating the structure of the semiconductor device according to Embodiment 2. The semiconductor device according to Embodiment 2 is different than the semiconductor device according to Embodiment 1 in that a third p+ region (fifth semiconductor region) 41 is formed in the n− drift region 2 at a position directly beneath the first p+ region 4 and separated from the second p+ region 5.

More specifically, the third p+ region 41 is formed directly beneath the first p+ region 4. It is preferable that the third p+ region 41 contact the first p+ region 4 and that the portion contacting the first p+ region 4 be as large as possible. It is more preferable that the third p+ region 41 cover the drain-side end of the first p+ region 4. The third p+ region 41 may also contact the p-type base region 3. The thickness t3 of the portion of the third p+ region 41 that is directly beneath the first p+ region 4 may be approximately greater than or equal to 0.1 µm and less than or equal to 1.0 µm, for example.

Forming the third p+ region 41 directly beneath the first p+ region 4 makes the breakdown voltage near the second p+ region 5 greater than the breakdown voltage near the drain-side end of the first p+ region 4. This allows avalanche breakdown to occur more easily near the drain-side end of the first p+ region 4, thereby making it possible to reduce the occurrence of avalanche breakdown at the bottom of the gate trench 8.

Moreover, it is preferable that the drain-side end of the third p+ region 41 be positioned further towards the drain side than the drain-side end of the second p+ region 5. This makes the electric field concentration at the third p+ region 41 stronger than the electric field concentration at the second p+ region 5 when the MOSFET is OFF, thereby making it possible to further reduce the occurrence of avalanche breakdown at the bottom of the gate trench 8.

Furthermore, it is preferable that the impurity concentration of the third p+ region 41 be greater than the impurity concentration of the first p+ region 4. This inhibits expansion of the depletion layer that expands into the third p+ region 41 from the p-n junction between the third p+ region 41 and the n− drift region 2, thereby further reducing the breakdown voltage near the drain-side end of the first p+ region 4. This makes it possible to further reduce the occurrence of avalanche breakdown at the bottom of the gate trench 8.

It is preferable that the width w4 of the third p+ region 41 be greater than the width w2 of the first p+ region 4 (that is, w4>w2). This is because this makes it possible to ensure that the drain-side end of the first p+ region 4 is reliably covered by the third p+ region 41 even if there are positioning errors in the mask patterns used when forming the first and third p+ regions 4 and 41.

Moreover, the third p+ region 41 has a uniform thickness t3, for example, and is arranged in a straight line-shaped planar layout parallel to the direction in which the first p+ region 4 extends in a straight line shape (that is, the direction going into the page in FIG. 7). In other words, the third p+ region 41 covers the entire drain-side end of the first p+ region 4.

Alternatively, a plurality of the third p+ regions 41 may be arranged in a dotted manner and at a prescribed interval in the direction in which the first p+ region 4 extends in a straight line shape. In other words, the drain-side end of the first p+ region 4 may be partially covered by the third p+ regions 41.

Next, a method of manufacturing the semiconductor device according to Embodiment 2 will be described. First, similar to in Embodiment 1, the n+ starting substrate (starting wafer) 1 is prepared, and the n− silicon carbide layer 21 is epitaxially grown on the front surface of the n+ starting substrate 1. Next, using a photolithography technology, an ion implantation mask (not illustrated in the figure) in which openings are formed in portions corresponding to formation regions for the third p+ regions 41 is formed on the surface of the n− silicon carbide layer 21. An oxide film mask may be used for this ion implantation mask, for example.

Next, using this ion implantation mask as a mask, p-type impurities such as aluminum are ion-implanted, for example. Here, the implantation depth of the ion-implanted p-type impurities is set to be deeper than the bottoms of first trenches 31 that will be formed in a later step. In this way, the third p+ regions 41 are selectively formed in the surface layer of the n− silicon carbide layer 21. Here, the depth of the third p+ regions 41 may be approximately 0.5 µm relative to the surface of the n− silicon carbide layer 21, for example. Then, the ion implantation mask used to form the third p+ regions 41 is removed.

Next, the steps of epitaxially growing the p-type silicon carbide layer 22 and on are performed in order similar to in Embodiment 1. Here, when forming the first and second trenches 31 and 32 (see FIG. 3), the first and second trenches 31 and 32 should be formed such that the bottoms of the second trenches 32 are positioned within the third p+ regions 41. Moreover, the second trenches 32 should be formed going through the p-type silicon carbide layer 22 in the depth direction and reaching the third p+ regions 41. This completes the SiC vertical MOSFET illustrated in FIG. 7.

Embodiment 2 as described above makes it possible to achieve the same advantageous effects as in Embodiment 1. Moreover, in Embodiment 2, forming the third p+ region beneath the drain-side end of the first p+ region and separated from the second p+ region makes it possible to further reduce electric field concentration at the bottom of the gate trench.

The present invention is not limited to the embodiments described above, and various modification may be made without departing from the spirit of the present invention. For example, the methods of manufacturing according to the embodiments above were described using an example in which the Si plane was selected to be the front surface of the silicon carbide substrate. However, any plane may be selected as long as crystal planes that exhibit faster oxidation speed than the front surface of the silicon carbide substrate are exposed along the sidewalls of the first trenches in which the second p+ regions are formed. Therefore, the m-plane may be selected to be the front surface of the silicon carbide substrate such that the sidewalls of the second and first trenches in which the first and second p+ regions are formed are c-planes, for example. Moreover, the sidewalls of the first and second trenches may be slanted relative to the substrate front surface such that the widths of the first and second trenches increase moving from the bottoms thereof towards the opening side.

Furthermore, the methods of manufacturing according to the embodiments above were described using an example in which the portions of the p+ silicon carbide layer (which becomes the second p+ regions) arranged along the sidewalls of the first trenches oxidize more quickly than other portions and are then removed. However, the portions of the p+ silicon carbide layer (which becomes the second p+ regions) arranged along the sidewalls of the first trenches may alternatively be removed using a selective etching process. In this case, the c-plane may be selected to be the front surface of the silicon carbide substrate. In addition, although the embodiments above were described as being MOSFETs as an example, the present invention is not limited to this example and may be applied to other MOS semiconductor devices such as insulated-gate bipolar transistors (IGBTs), for example.

Moreover, although the embodiments above were described using an example in which silicon carbide was used as the wide-bandgap semiconductor, the present invention can also be applied when using a wide-bandgap semiconductor other than silicon carbide such as gallium nitride (GaN), for example. Furthermore, the present invention still exhibits all of the same advantageous effects even if the conductivity types (n-type and p-type) are inverted.

Industrial Applicability

As described above, the semiconductor device and method of manufacturing the semiconductor device according to the present invention are effective in vertical trench gate MOS semiconductor devices that use a wide-bandgap semiconductor and are particularly well-suited for use in vertical MOSFETs that use silicon carbide. It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A semiconductor device, comprising:
   a semiconductor substrate made of a semiconductor having a wider bandgap than silicon;
   a first semiconductor layer of a first conductivity type formed on a front surface of the semiconductor substrate;
   a second semiconductor layer of a second conductivity type formed on a surface of the first semiconductor layer on a side opposite to the semiconductor substrate;
   a first semiconductor region of the first conductivity type selectively formed within the second semiconductor layer;
   a trench that goes through the first semiconductor region and the second semiconductor layer in a depth direction and reaches the first semiconductor layer;
   a gate electrode formed within the trench with a gate insulating film interposed between the gate electrode and an inner surface of the trench;
   a second semiconductor region of the second conductivity type that is formed separated and laterally isolated from the trench, penetrates through and across the second semiconductor layer in the depth direction and reaches the first semiconductor layer so that a bottom of the second semiconductor region is embedded in the first semiconductor layer, the second semiconductor region having a greater impurity concentration than the second semiconductor layer;
   a third semiconductor region of the second conductivity type that is formed within the first semiconductor layer separated from the second semiconductor layer and the second semiconductor region, covers a bottom of the trench, and has a greater impurity concentration than the second semiconductor layer;
   a first electrode that is electrically connected to the first semiconductor region and the second semiconductor layer;
   a second electrode formed on a rear surface of the semiconductor substrate; and
   a fourth semiconductor region of the second conductivity type that is selectively formed within the second semiconductor layer and has a greater impurity concentration than the second semiconductor region,
   wherein the first electrode contacts the first semiconductor region and the fourth semiconductor region, and
   wherein the second semiconductor region is formed on a side of the fourth semiconductor region facing the second electrode and contacts the fourth semiconductor region.

2. The semiconductor device according to claim 1, wherein a width of the second semiconductor region is less than a width of the trench.

3. The semiconductor device according to claim 1, wherein the bottom of the second semiconductor region facing the second electrode is positioned closer to the second electrode in depth than the bottom of the trench.

4. The semiconductor device according to claim 1, wherein the second semiconductor region is an epitaxial layer.

5. The semiconductor device according to claim 1, wherein the third semiconductor region is an epitaxial layer.

6. The semiconductor device according to claim 1, wherein the semiconductor having a wider bandgap than silicon is silicon carbide.

7. The semiconductor device according to claim 1,
wherein a surface of the second semiconductor layer on a side opposite to the first semiconductor layer is a (0001) plane, and
wherein sidewalls of the trench are {1-100} planes.

8. The semiconductor device according to claim 1, wherein the second semiconductor layer has a second conductivity type impurity concentration profile that exhibits a Gaussian distribution with differing impurity concentrations from high to low in the depth direction from a position that has a highest impurity concentration.

9. A semiconductor device, comprising:
a semiconductor substrate made of a semiconductor having a wider bandgap than silicon;
a first semiconductor layer of a first conductivity type formed on a front surface of the semiconductor substrate;
a second semiconductor layer of a second conductivity type formed on a surface of the first semiconductor layer on a side opposite to the semiconductor substrate;
a first semiconductor region of the first conductivity type selectively formed within the second semiconductor layer;
a trench that goes through the first semiconductor region and the second semiconductor layer in a depth direction and reaches the first semiconductor layer;
a gate electrode formed within the trench with a gate insulating film interposed between the gate electrode and an inner surface of the trench;
a second semiconductor region of the second conductivity type that is formed separated and laterally isolated from the trench, penetrates through and across the second semiconductor layer in the depth direction and reaches the first semiconductor layer so that a bottom of the second semiconductor region is embedded in the first semiconductor layer, the second semiconductor region having a greater impurity concentration than the second semiconductor layer;
a third semiconductor region of the second conductivity type that is formed within the first semiconductor layer separated from the second semiconductor layer and the second semiconductor region, covers a bottom of the trench, and has a greater impurity concentration than the second semiconductor layer;
a first electrode that is electrically connected to the first semiconductor region and the second semiconductor layer;
a second electrode formed on a rear surface of the semiconductor substrate; and
a fourth semiconductor region of the second conductivity type formed within the first semiconductor layer on a side of the second semiconductor region facing the second electrode.

10. The semiconductor device according to claim 9, further comprising:
a fifth semiconductor region of the second conductivity type that is selectively formed within the second semiconductor layer and has a greater impurity concentration than the second semiconductor region,
wherein the first electrode contacts the first semiconductor region and the fifth semiconductor region, and
wherein the second semiconductor region is formed on a side of the fifth semiconductor region facing the second electrode and contacts the fifth semiconductor region.

11. The semiconductor device according to claim 9, wherein a width of the fourth semiconductor region is greater than the width of the second semiconductor region.

12. The semiconductor device according to claim 9, wherein the fourth semiconductor region covers the bottom of the second semiconductor region facing the second electrode.

13. The semiconductor device according to claim 9,
wherein the trench is formed in a linear layout that extends parallel to the front surface of the semiconductor substrate, and
wherein the second semiconductor region and the fourth semiconductor region are formed in linear layouts parallel to a direction in which the trench linearly extends.

14. The semiconductor device according to claim 9,
wherein the trench is formed in a linear layout that extends parallel to the front surface of the semiconductor substrate,
wherein the second semiconductor region is formed in a linear layout parallel to a direction in which the trench linearly extends, and
wherein the fourth semiconductor region is arranged in a plurality at a prescribed interval in a direction in which the second semiconductor region linearly extends.

15. The semiconductor device according to claim 9, wherein an impurity concentration of the fourth semiconductor region is greater than the impurity concentration of the second semiconductor region.

16. The semiconductor device according to claim 9, wherein a width of the second semiconductor region is less than a width of the trench.

17. The semiconductor device according to claim 9, wherein the bottom of the second semiconductor region facing the second electrode is positioned closer to the second electrode in depth than the bottom of the trench.

18. The semiconductor device according to claim 9, wherein the second semiconductor layer has a second conductivity type impurity concentration profile that exhibits a Gaussian distribution with differing impurity concentrations from high to low in the depth direction from a position that has a highest impurity concentration.

19. A semiconductor device, comprising:
a semiconductor substrate made of a semiconductor having a wider bandgap than silicon;
a first semiconductor layer of a first conductivity type formed on a front surface of the semiconductor substrate;
a second semiconductor layer of a second conductivity type formed on a surface of the first semiconductor layer on a side opposite to the semiconductor substrate;
a first semiconductor region of the first conductivity type selectively formed within the second semiconductor layer;
a trench that goes through the first semiconductor region and the second semiconductor layer in a depth direction and reaches the first semiconductor layer;

a gate electrode formed within the trench with a gate insulating film interposed between the gate electrode and an inner surface of the trench;

a second semiconductor region of the second conductivity type that is formed separated and laterally isolated from the trench, penetrates through and across the second semiconductor layer in the depth direction and reaches the first semiconductor layer so that a bottom of the second semiconductor region is embedded in the first semiconductor layer, the second semiconductor region having a greater impurity concentration than the second semiconductor layer;

a third semiconductor region of the second conductivity type that is formed within the first semiconductor layer separated from the second semiconductor layer and the second semiconductor region, covers a bottom of the trench, and has a greater impurity concentration than the second semiconductor layer;

a first electrode that is electrically connected to the first semiconductor region and the second semiconductor layer; and a second electrode formed on a rear surface of the semiconductor substrate, wherein the second semiconductor layer has a second conductivity type impurity concentration profile that exhibits a Gaussian distribution with differing impurity concentrations from high to low in the depth direction from a position that has a highest impurity concentration.

20. The semiconductor device according to claim 19, wherein a width of the second semiconductor region is less than a width of the trench.

21. The semiconductor device according to claim 19, wherein the bottom of the second semiconductor region facing the second electrode is positioned closer to the second electrode in depth than the bottom of the trench.

* * * * *